(12) United States Patent  
Mather et al.

(10) Patent No.: US 9,111,249 B2
(45) Date of Patent: *Aug. 18, 2015

(54) PHYSICAL LAYER MANAGEMENT (PLM) SYSTEM FOR USE WITH AN OPTICAL DISTRIBUTION FRAME USING RFID ANTENNAS WITH LOCALIZED FIELDS

(71) Applicants: Tyco Electronics UK Ltd, Wiltshire (GB); Tyco Electronics Raychem BVBA, Kessel-Lo (BE)

(72) Inventors: David Mather, Cheshire (GB); Ian Miles Standish, Flintshire N Wales (GB); Kristof Johan Jeuris, Leuven (BE); Stephen Lambourn, Wiltshire (GB); Peter Baston, Flintshire (GB); David Nicolas Atkinson, Colwyn Bay (GB); John Michael Hulse, Gwynedd (GB)

(73) Assignees: Tyco Electronics UK LTD, Wiltshire (GB); Tyco Electronics Raychem BVBA, Kessel-Lo (BE)

( * ) Notice: Subject to any disclaimer, the term of this patent is extended or adjusted under 35 U.S.C. 154(b) by 179 days.

This patent is subject to a terminal disclaimer.

(21) Appl. No.: 13/766,151

(22) Filed: Feb. 13, 2013

(65) Prior Publication Data

US 2013/0207782 A1  Aug. 15, 2013

Related U.S. Application Data

(60) Provisional application No. 61/598,713, filed on Feb. 14, 2012.

(51) Int. Cl.
  H04Q 5/22  (2006.01)
  G06Q 10/08  (2012.01)
  (Continued)

(52) U.S. Cl.
  CPC ............... *G06Q 10/087* (2013.01); *G06F 1/16* (2013.01); *G06K 7/10178* (2013.01); *H04Q 1/138* (2013.01); *Y10T 29/49004* (2015.01)

(58) Field of Classification Search
  USPC ........ 340/10.1, 572.1, 572.7, 539.1; 235/439; 439/491
  See application file for complete search history.

(56) References Cited

U.S. PATENT DOCUMENTS 5,821,510 A  10/1998  Cohen et al.
5,910,776 A  6/1999  Black
(Continued)

FOREIGN PATENT DOCUMENTS

WO  2011057383  5/2011

OTHER PUBLICATIONS

The International Bureau of WIPO, "Notification Concerning Transmittal of International Preliminary Report on Patentability", "from PCT Application Serial No. PCT/EP2013/000441", Aug. 28, 2014, pp. 1-10, Published in: WO.

(Continued)

*Primary Examiner* — Toan N Pham
(74) *Attorney, Agent, or Firm* — Fogg & Powers LLC

(57) ABSTRACT

One embodiment is directed to a tray for use in a subrack of a rack, the tray comprising a printed circuit board configured so that a plurality of connections can be made at a plurality of positions on the printed circuit board. Each of the plurality of connections involves at least one connector having an RFID tag associated therewith. The tray further comprises a plurality of RFID antennas integrated into the printed circuit board, each the RFID antennas associated with a respective one of the positions. The printed circuit board is configured to localize a field emitted from each RFID antenna so that only the RFID tag associated with that RFID antenna is energized and read.

15 Claims, 14 Drawing Sheets

(51) Int. Cl.
*G06F 1/16* (2006.01)
*G06K 7/10* (2006.01)
*H04Q 1/02* (2006.01)

(56) References Cited

U.S. PATENT DOCUMENTS

| | | | |
|---|---|---|---|
| 6,002,331 | A | 12/1999 | Laor |
| 6,378,111 | B1 | 4/2002 | Brenner et al. |
| 6,499,861 | B1 | 12/2002 | German et al. |
| 6,784,802 | B1 | 8/2004 | Stanescu |
| 6,808,116 | B1 | 10/2004 | Eslambolchi et al. |
| 6,847,856 | B1 | 1/2005 | Bohannon |
| 7,046,899 | B2 | 5/2006 | Colombo et al. |
| 7,197,214 | B2 | 3/2007 | Elkins, II et al. |
| 7,246,746 | B2 | 7/2007 | McNamara |
| 7,406,231 | B1 | 7/2008 | Beck et al. |
| 7,468,669 | B1 | 12/2008 | Beck et al. |
| 7,547,150 | B2 | 6/2009 | Downie et al. |
| 7,605,707 | B2 | 10/2009 | German et al. |
| 7,667,574 | B2 | 2/2010 | Downie et al. |
| 7,760,094 | B1 | 7/2010 | Kozischek et al. |
| 7,772,975 | B2 | 8/2010 | Downie et al. |
| 7,782,202 | B2 | 8/2010 | Downie et al. |
| 7,855,697 | B2 | 12/2010 | Chamarti et al. |
| 7,856,166 | B2 | 12/2010 | Biribuze et al. |
| 7,965,186 | B2 | 6/2011 | Downie et al. |
| 8,050,939 | B2 | 11/2011 | Graves et al. |
| 8,075,348 | B2 | 12/2011 | Mei et al. |
| 8,092,249 | B2 | 1/2012 | German et al. |
| 8,116,434 | B2 | 2/2012 | German et al. |
| 8,138,925 | B2 | 3/2012 | Downie et al. |
| 8,172,468 | B2 | 5/2012 | Jones et al. |
| 8,181,229 | B2 | 5/2012 | Macauley |
| 8,203,450 | B2 | 6/2012 | German et al. |
| 8,248,208 | B2 | 8/2012 | Renfro, Jr. |
| 8,264,355 | B2 | 9/2012 | Kozischek et al. |
| 8,264,366 | B2 | 9/2012 | Chamarti et al. |
| 2001/0024360 | A1 | 9/2001 | Hirata et al. |
| 2010/0210135 | A1 | 8/2010 | German et al. |
| 2011/0116755 | A1 | 5/2011 | Rolston |
| 2012/0007717 | A1 | 1/2012 | Jong |
| 2013/0205579 | A1* | 8/2013 | Mather et al. .................. 29/593 |
| 2013/0207782 | A1 | 8/2013 | Mather et al. |
| 2013/0306723 | A1* | 11/2013 | Mather et al. ................ 235/385 |

OTHER PUBLICATIONS

European Patent Office, "International Search Report", "from PCT Application Serial No. PCT/EP2013/000441", Aug. 21, 2013, pp. 115, Published in: WO.

"ID Tag Requirements for Infrastructure and Network Elements Management", Dec. 2011, pp. 1-32, Publisher: International Telecommunication Union.

Intellectual Property Office New Zealand, "First Examination Report from NZ Application No. 628612 mailed Mar. 19, 2015", "from Foreign Counterpart of U.S. Appl. No. 13/766,120", Mar. 19, 2015, pp. 1-3, Published in: NZ.

U.S. Patent and Trademark Office, "Restriction Requirement", "U.S. Appl. No. 13/766,137", Dec. 4, 2014, pp. 1-10.

* cited by examiner

PHYSICAL LAYER MANAGEMENT (PLM) SYSTEM FOR USE WITH AN OPTICAL DISTRIBUTION FRAME USING RFID ANTENNAS WITH LOCALIZED FIELDS

CROSS-REFERENCE TO RELATED APPLICATION

This application claims the benefit of U.S. Provisional Patent Application Ser. No. 61/598,713, filed on Feb. 14, 2012, which is hereby incorporated herein by reference.

BACKGROUND

This application relates to providing physical layer management in an optical distribution frame.

SUMMARY

One embodiment is directed to a tray for use in a subrack of a rack, the tray comprising a printed circuit board configured so that a plurality of connections can be made at a plurality of positions on the printed circuit board. Each of the plurality of connections involves at least one connector having an RFID tag associated therewith. The tray further comprises a plurality of RFID antennas integrated into the printed circuit board, each the RFID antennas associated with a respective one of the positions. The printed circuit board is configured to localize a field emitted from each RFID antenna so that only the RFID tag associated with that RFID antenna is energized and read.

Another embodiment is directed to a method of using a tray. The tray comprises a printed circuit board and a plurality of RFID antennas integrated into the printed circuit board. Each the RFID antennas associated with a respective one of a plurality of positions on the printed circuit board. The method comprises making a plurality of connections at the plurality of positions on the printed circuit board. Each of the plurality of connections involves at least one connector having an RFID tag associated therewith. The method further comprises energizing and reading the RFID tags using the RFID antennas and localizing a field emitted from each RFID antenna so that only the RFID tag associated with that RFID antenna is energized and read.

DRAWINGS

DETAILED DESCRIPTION

Figure 1:
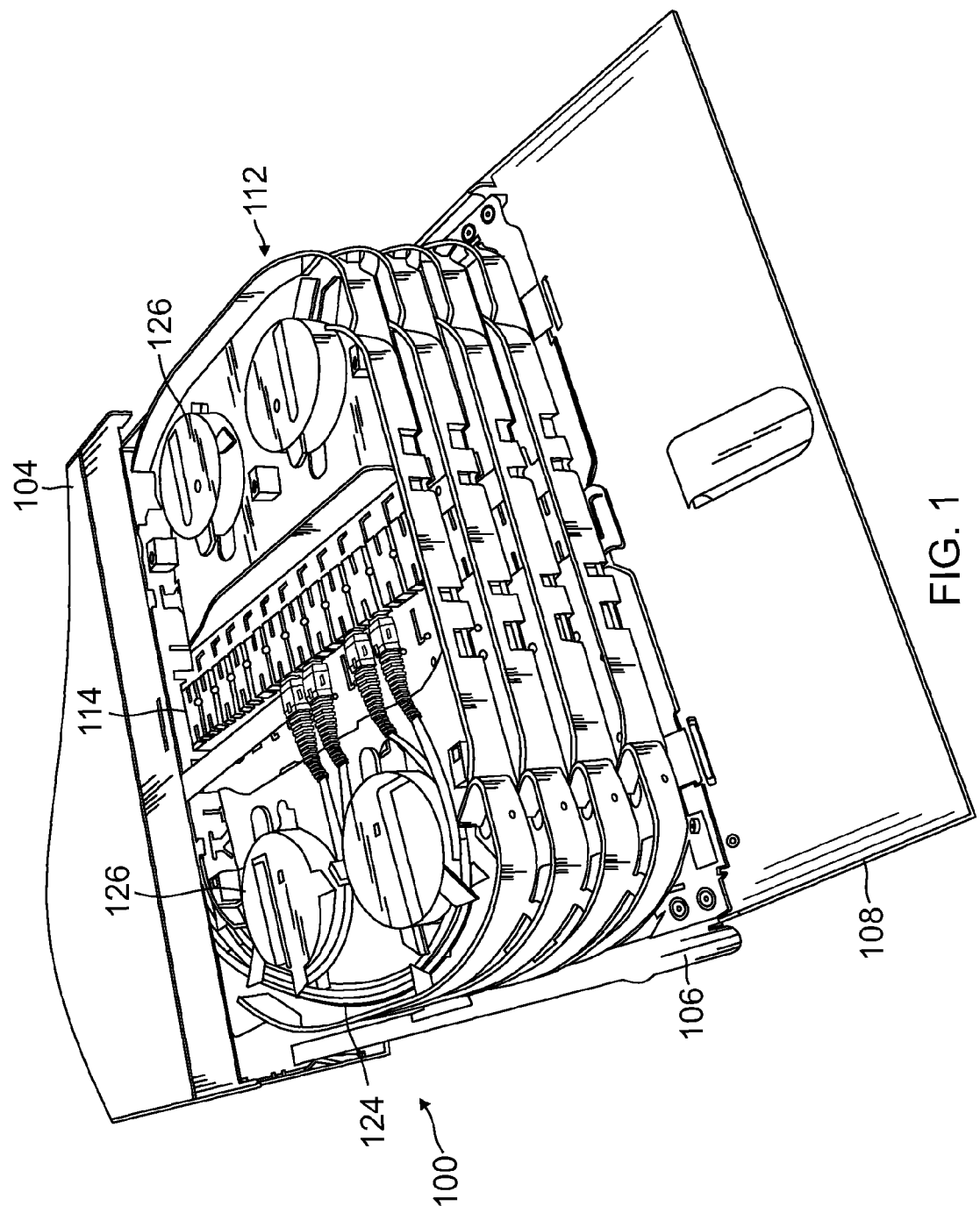
FIG. 1 illustrates one exemplary embodiment of a subrack.
Figure 2:
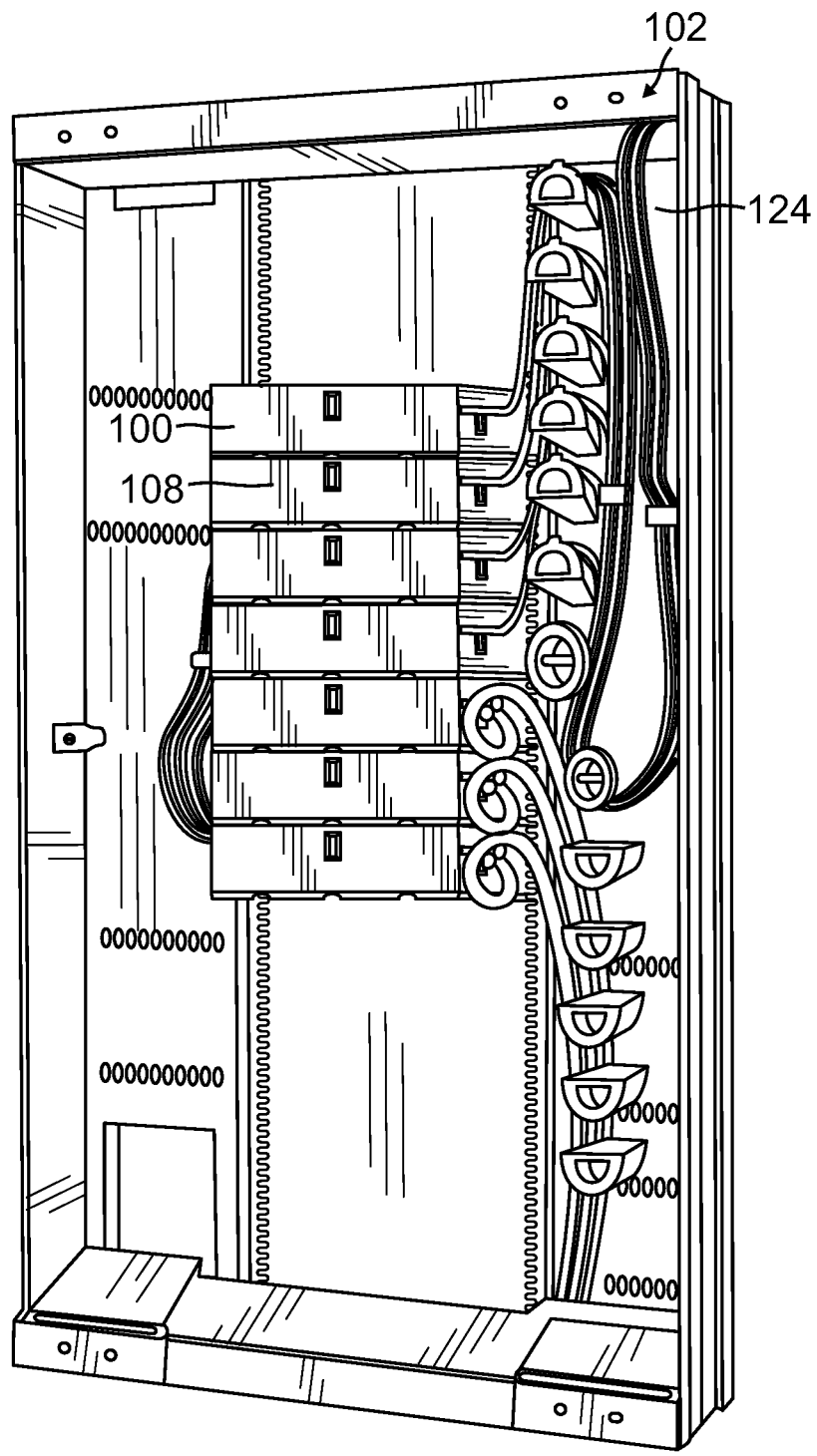
FIG. 2 illustrates one exemplary embodiment of a rack in which the exemplary subrack of FIG. 1 can be used.

FIG. 1 illustrates one exemplary embodiment of a subrack 100 (also referred to as a general patch splice patch tray or "GPST"). In one example, an optical distribution frame comprises one or more racks in which one or more subracks 100 are mounted. One example of a frame 102 in which multiple subracks are mounted is shown in FIG. 2.

Each subrack 100 comprises an enclosure 104 and a shelf 106. Each subrack 100 is configured so that the shelf 106 can slide in and out of an opening formed in the front of the enclosure 104. A front panel 108 is attached to the front of the shelf 106 so that when the shelf 106 has been completely pushed into the enclosure 104, the front panel 108 can be flipped up to close the front opening of the enclosure 104. Also, the font panel 108 can be flipped done to allow the shelf 106 to slide out of the enclosure 104.

Each subrack 100 includes a backplate 110 that extends generally vertically from the top of the shelf 106. Each subrack 100 includes multiple trays 112 that are vertically stacked. Each tray 112 is rotatably mounted to the backplate 110 so that the tray 112 can flipped up in order to provide access to the tray 112 that is underneath it (if there is one). Also, each tray 112 is removably mounted to the backplate 110 so that the tray 112 can be easily removed from the subrack 100 in order to assist in providing access to that tray or to trays 112 that are underneath it. The tray 112 can also be easily re-mounted to the backplate 110.

Figure 3A:
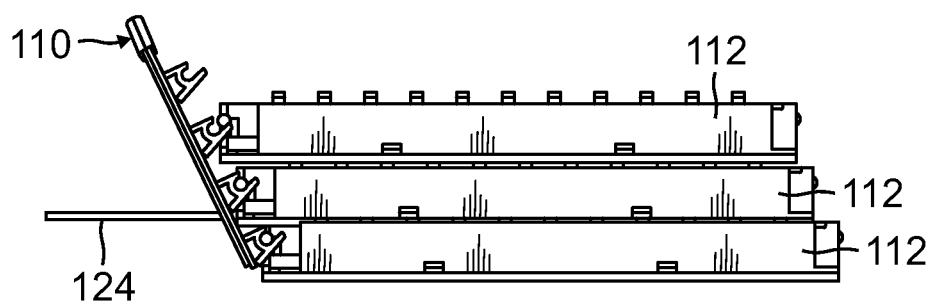
FIGS. 3A-3B illustrate the stacking of trays in the exemplary subrack of FIG. 1.
Figure 3B:
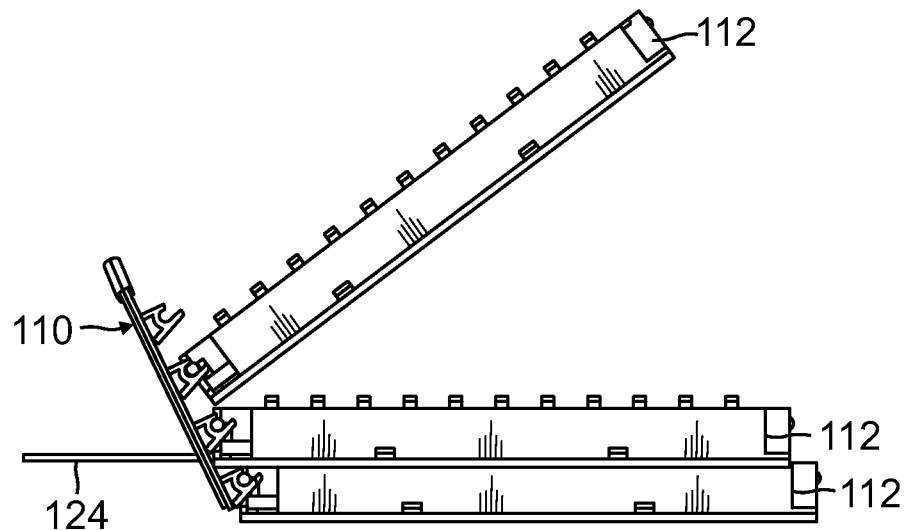

In this example, as shown in FIGS. 3A-3B, the backplate 110 is vertically disposed at angle so that the trays 112 are arranged in a stair step configuration (though this need not be the case).

In the exemplary embodiments described here, each tray 112 incorporates managed connectivity technology. Generally, a plurality of connections can be made at a plurality of positions on the tray 112, where each of the plurality of connections involves at least one connector. The managed connectivity technology generally takes the form of a device (for example, an RFID tag or an EEPROM) that is attached to or integrated into at least one connector used to make each such connection. Information is stored in the managed connectivity connector device. In these examples, as explained in more detail below, the tray 112 is configured so that either side of the tray can be used as the patch side of the tray 112. Also, the tray 112 is configured to read the information stored in the managed connectivity devices.

More specifically, in the example describe here, each tray 112 is configured to hold multiple fiber optic adapters 114 (where each adapter 114 is associated with one of the plurality of positions where a connection can be made). Each adapter 114 is configured to optically couple each optical fiber in a set of one or more optical fibers to a respective optical fiber in another set of one or more optical fibers. Typically, each such set of one or more optical fibers is terminated with a connector 116. Most typically, each such adapter 114 is used to couple a single fiber to another single fiber. Each adapter 114 comprises two ports 118 to receive and hold the two connectors 116 in place while optically coupling the fibers.

Examples of fiber optic adapters 114 and connectors 116 that can be used include SC, LC, FC, LX.5, MTP, or MPO connectors. Other adapters and connectors can used.

In this example, the fiber optic adapters 114 are arranged and held on the tray 112 so that the ports 118 on each side of the adapters 114 all face the same direction and are aligned with one another. In the following description each tray 112 and the adapters 114 held by that tray 112 are described as having a first or left side and a second or right side.

Figure 4:
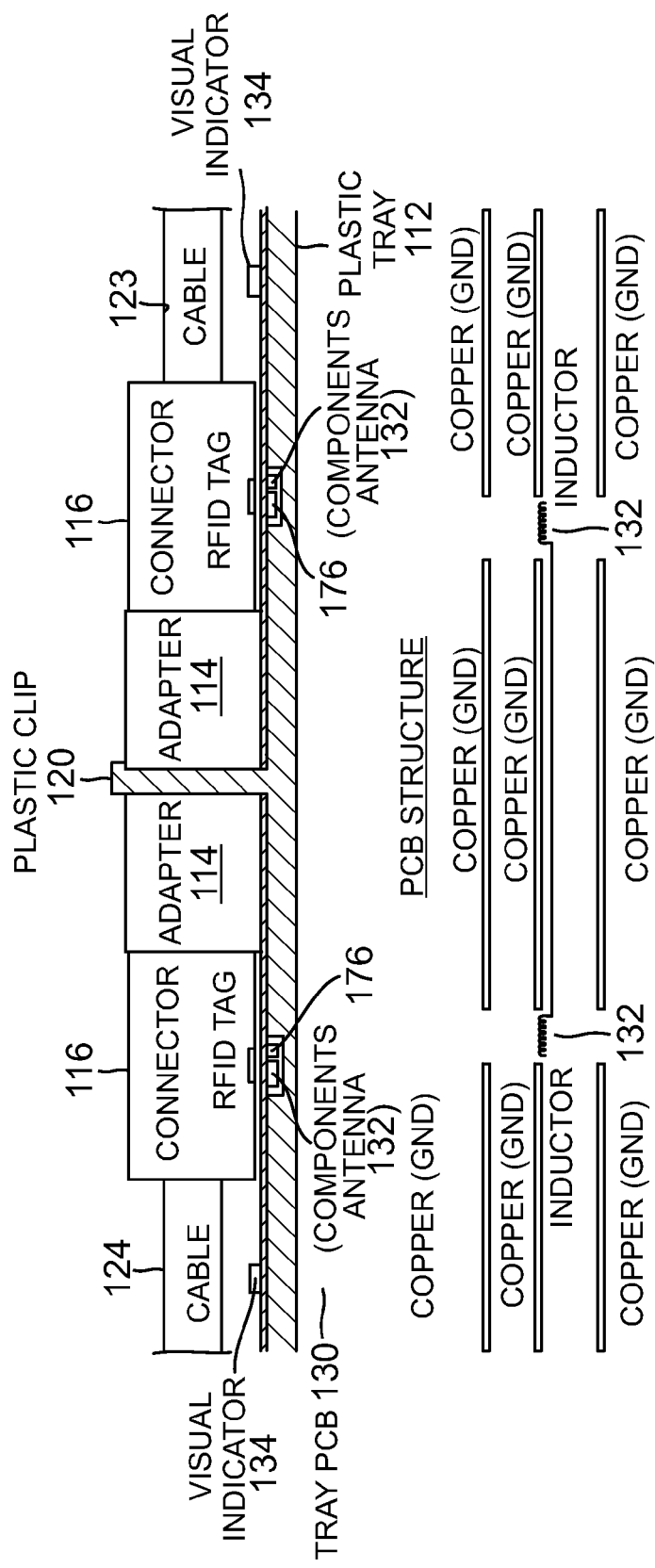
FIG. 4 illustrates how a fiber adapter can be removably attached to a tray in the exemplary subrack of FIG. 1 as well as the structure of a printed circuit board used in the tray.

Also, as shown in FIG. 4, in this example, each adapter 114 is held on the tray 112 by a plastic clip 120. This allows each fiber optic adapter 114 to be easily removed and attached to the tray 112.

In this example, each tray 112 can be configured to have one side of the tray 112 and adapters 114 serve as the "patch field" or "patch side". The patch side is the side of the tray and adapters where the optical patching is performed. The other side of the tray 112 and adapters 114 serve as the "fixed side". Typically, connectors 116 attached to one end of optical patch cords 122 are attached to the ports 118 on the patch side. Connectors attached to the other end of the patch cords exit that tray and are typically connected to a port on the patch side of another adapter or another device in the network.

Connectors 116 attached to one end of the fixed optical cabling 124 are attached to the ports 118 on the fixed sides. The fixed optical cabling 124 can be an optical pigtail, in which case the other end of the pigtail comprises a fiber that is spliced (for example, using a smooth) to another longer optical fiber that exits the tray 112. The other end of the longer cable is connected as appropriate (for example, at another optical node located somewhere else in the network). The fixed optical cables 124 that are connected to the ports 118 on the fixed side of the tray 112 can themselves exit the tray 112 (like the patch cords 122 attached to the ports 118 on the patch side of the tray 112) and can be connected as appropriate (for example, at another optical node located somewhere else in the network).

As shown in FIG. 1, each tray 112 typically is configured to include two removable island assemblies 126, where one island assembly 126 is attached to the patch side of the tray 112 and the other island assembly 126 is attached to the fixed side of the tray 112. The island assemblies 126 are configured to facilitate the routing and/or splicing of the fiber optic cabling that is attached to the ports 118 on that side. The island assemblies 126 in each tray can be reconfigured as needed by removing and inserting appropriate island assemblies 126.

In this example, the connectors 116 attached to the patch side of the adapters 114 have RFID tags 128 (shown in FIG. 4) attached, or integrated into, them. The RFID tags 128 store a unique identifier for the connector 116 and/or the patch cord 122 that can be used to identify which patch cord 122 is attached to each patch port 118. The RFID tags 128 can store other information, and can be written to as well as read from.

A printed circuit board 130 (also referred to here as the "tray PCB" 130) is attached to the bottom of each tray 112. The tray PCB 130 includes a respective RFID antenna or coil 132 and respective LED (or other visual indicator) 134 positioned near each side of each fiber optic adapter 114. That is, each fiber optic adapter 114 has a associated pair of RFID antennas 132, a first one of which is located near a first one port 118 of the adapter 114 and second one of which is located near the other port 118 of the adapter 114.

Each RFID antenna or coil 132 is used for reading an RFID tag 130 inserted into the respective port 118, and each LED or other visual indicator 134 is used for visually identifying the respective port 118 (for example, in connection with guiding a technician in carrying out a work order).

Even though the ports 118 on only one side of the tray 112 are used as the patch ports at any given time, there are RFID antennas or coils 132 and LEDs (or other visual indicators) 134 positioned on each side of the adapters 114 so that the same tray 112 and tray PCB 130 can be used to support patching on either side of the tray 112.

A PCB 136 is mounted in the shelf 106 of each subrack 100. This PCB 136 is also referred to here as the "subrack PCB" 136 or the "subrack controller card" 136. Components of the subrack PCB 136 are coupled to components on each of the tray PCBs 130 using a backplane PCB 138. The subrack PCB 136 includes a flexible circuit or ribbon cable 140 to which a suitable backplane connector 142 is attached. This backplane connector 142 is attached to a connector on the backplane PCB 144.

Likewise, each tray PCB 130 includes a flexible circuit or ribbon cable 144 to which a suitable backplane connector 146 is attached. This backplane connector 146 is attached to a connector 148 on the backplane PCB 138. In this example, the backplane connector 148 of each tray 112 is held in place by a pair of tethers 150 (for example, plastic tethers typically used for attaching price tags to items of clothing and the like) that are attached to both the tray 112 and the backplane connector 146. See FIGS. 7-11. The tethers 150 and backplane connector 146 are configured so that when the tray 118 is removed from the backplate 110 (backplane PCB 138), the tethers 150 will pull the backplane connector 146 out of the connector 148 on the backplane 138 before the flexible circuit or ribbon cable 144 is pulled on. This is done to protect the flexible circuit or ribbon cable 144 from being damaged by removing the tray 112 from the backplane 138. Also, the tethers 150 help hold the backplane connector 146 in place to ease insertion of the backplane connector 146 onto the connector 148 on the backplane PCB 138 when the tray 112 is re-attached.

In this example, the backplate 110 to which the trays 112 are attached comprises the backplane PCB 138. That is, the functions of the backplate 110 are performed at least in part by the backplane PCB 138. Moreover, the backplane PCB 138 includes cut outs 152 to which plastic strain relief cables 154 can be attached. Strain relief cables 154 are used to hold the fiber optic cabling attached to the ports 118 of that tray 112 in place so as to relieve the strain (for example, due to pulling on the cables) that otherwise might affect the cables or the connections provided at the ports 118 or splices housed in the tray 112.

Figure 5:
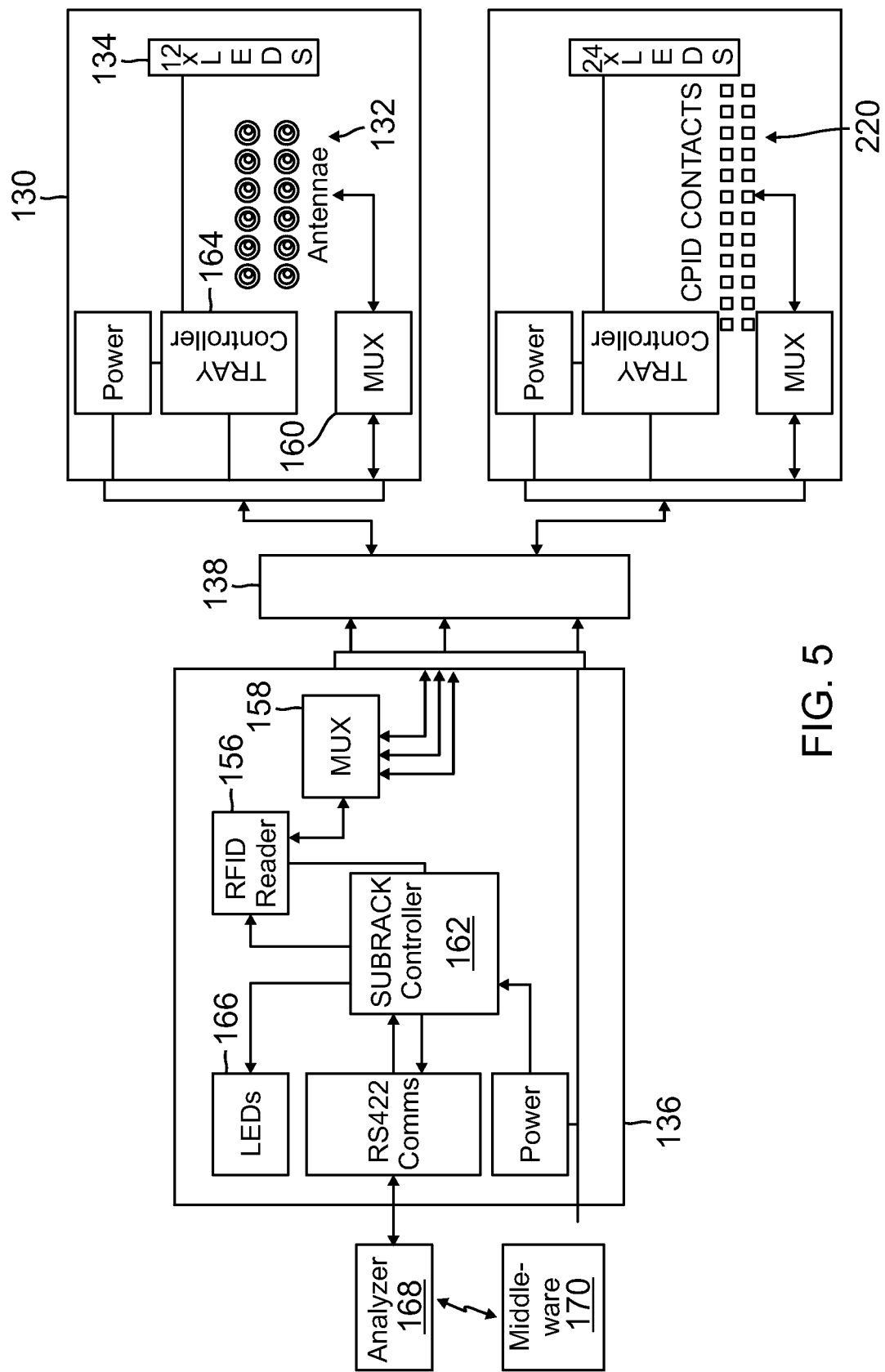
FIGS. 5-6 are block diagrams illustrating one example of how active components can be integrated into the exemplary subrack of FIG. 1.
Figure 6:
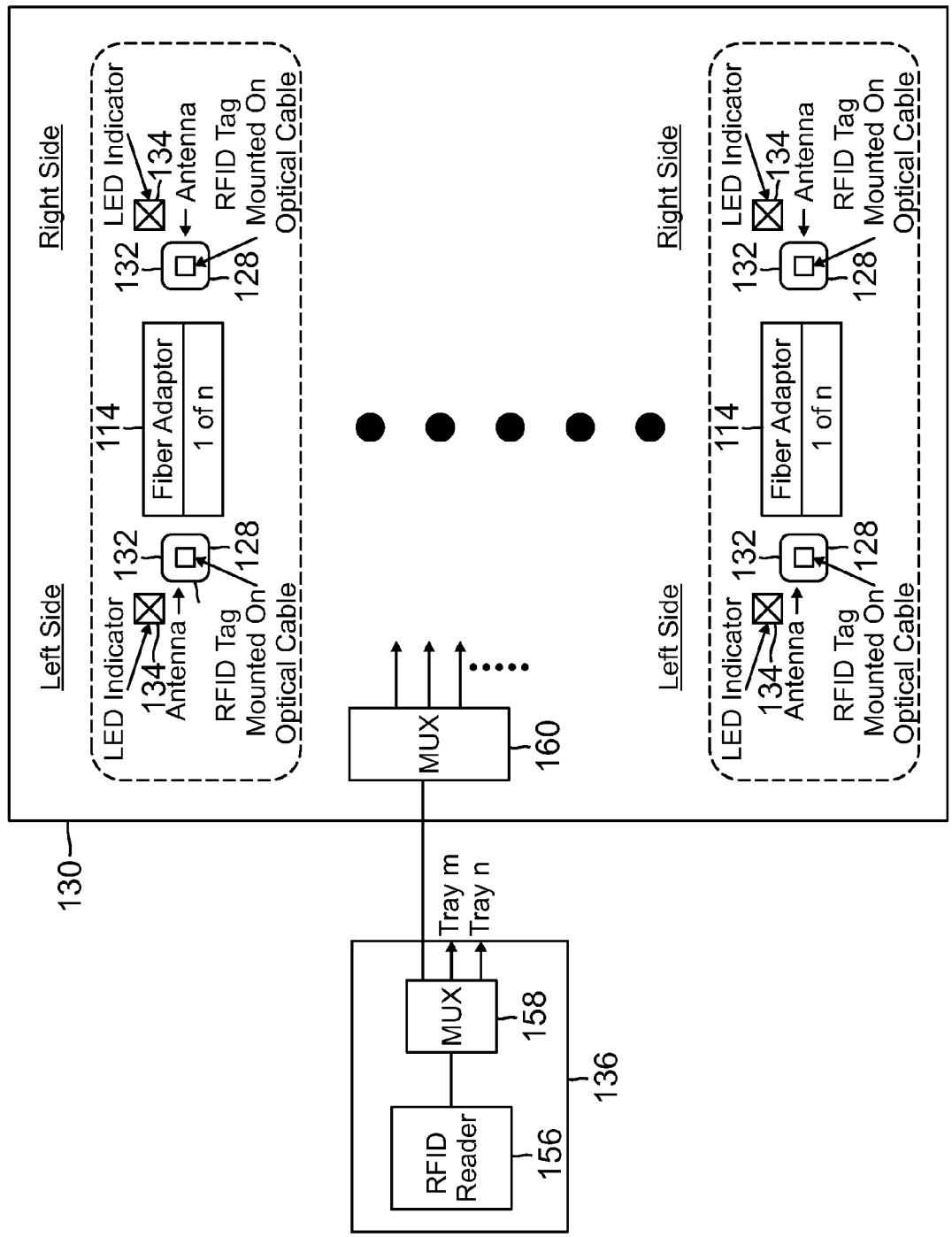
Figure 7:
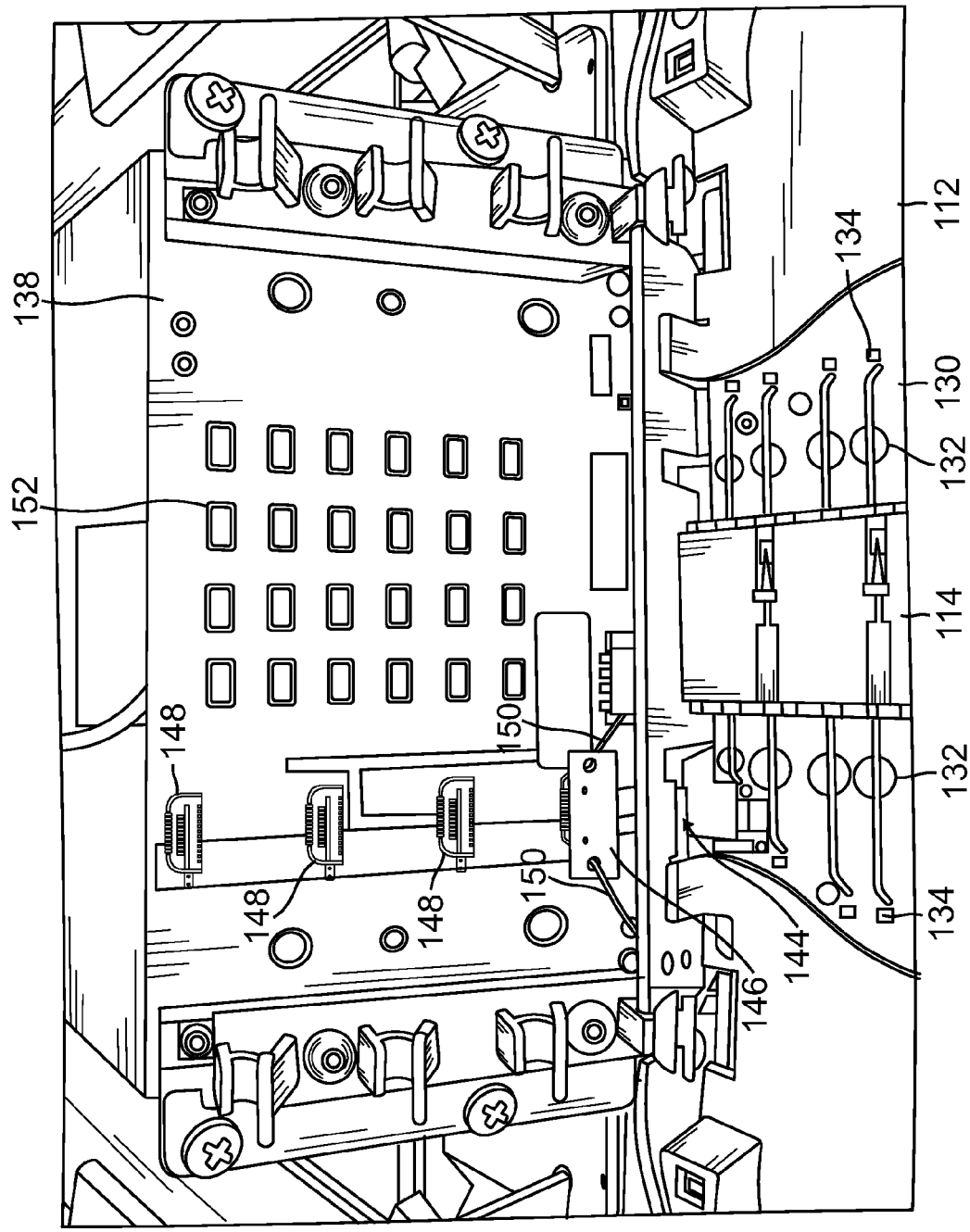
FIGS. 7-11 illustrate the use of plastic tethers and cut-outs in the exemplary subrack of FIG. 1.
Figure 8:
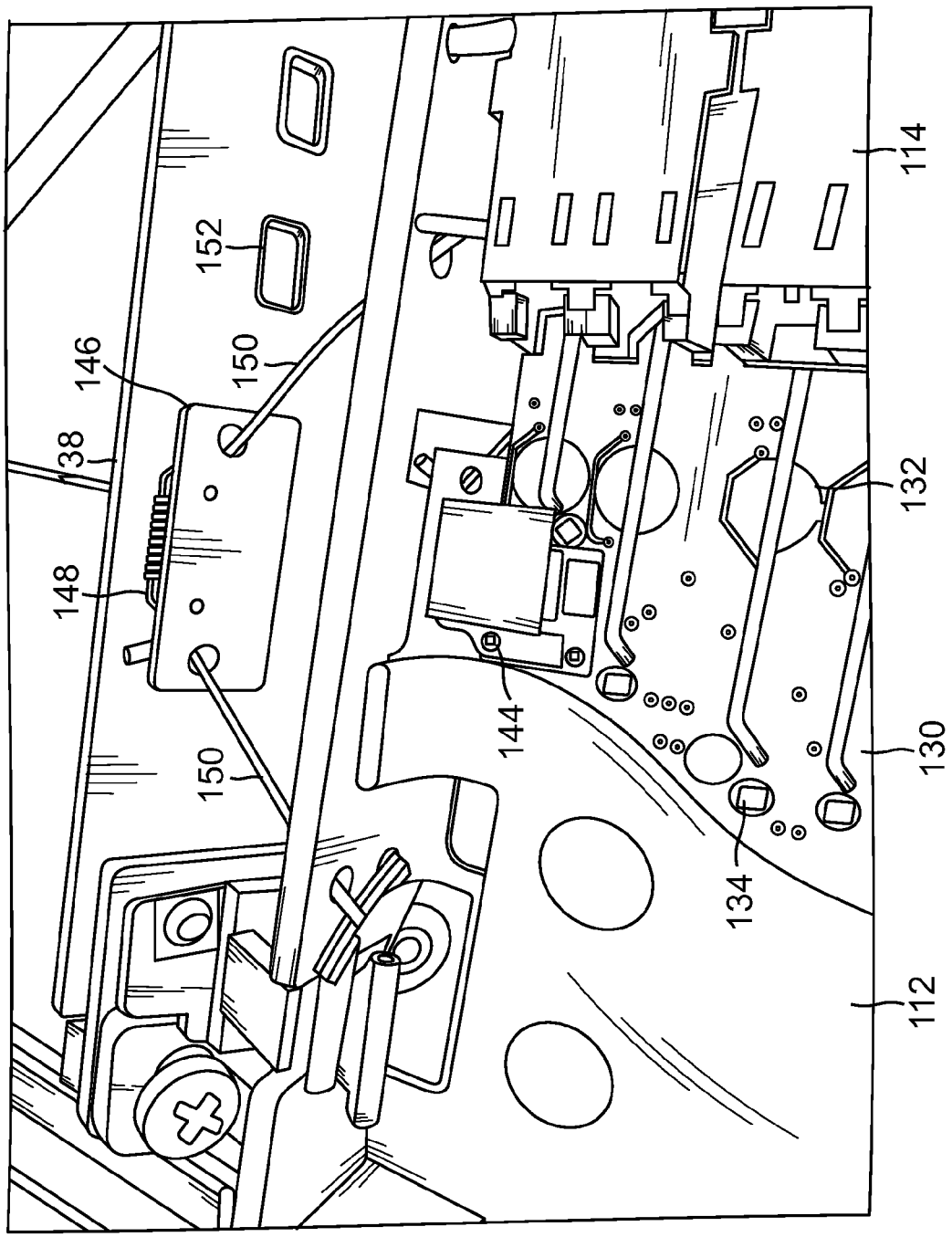

As shown in FIGS. 5 and 6, the subrack PCB 136 includes an RFID reader 156. The RFID reader 156 can be selectively coupled to the pair of RFID antennas or coils 132 positioned near each of the adapters 114 in each subrack 100. To do this, the subrack PCB 136 includes a first multiplexer 158 to couple the RF I/O port of the RFID reader 156 to another multiplexer 160 located on one of the tray PCBs 130. A multiplexer 160 located on each tray PCB 130 is used to selectively couple the RF I/O port of the RFID reader 156 to one of the RFID antenna pairs 132 included on that tray PCB 130.

In this way, only one RFID reader 156 is needed to read RFID tags 128 associated with each of the many fiber optic adapters 114 held on the many trays 112 of the subrack 100.

A controller 162 is located on the subrack PCB 136, and a controller 164 is located on each of the tray PCBs 130. Each controller 162 and 164 can be implemented using a suitable programmable processor for executing software. The software executing on the programmable processor performs at least some of the processing described here as being performed by each of the controllers 162 and 164.

The subrack controller 162 is coupled to the RFID reader 156, the subrack multiplexer 158, and an LED 166 that is mounted to the subrack 100 (for example, to the front panel 108 of the subrack 100). Also, the subrack controller 162 is coupled to each of the tray controllers 164 via the backplane 138.

Each tray controller 164 is coupled to the tray multiplexer 160 on that tray 112 and the LEDs (or other visual indicators) 134 on that tray 112.

The subrack controller 162 is coupled to an overall rack controller 168 (also referred to here as the "analyzer"). The analyzer 168 is configured to cause the subrack controller 162 and the tray controllers 164 to read the RFID tag 128 that is attached to any connector 116 inserted into each patch port 118. This can be done in a polling manner, where periodically each such patch port 118 is read. This can be done in other ways as well. Reading of a particular RFID tag 128 is done by instructing the subrack controller 162 and tray controller 164 to configure the multiplexers 158 and 160 to couple the RFID reader 156 to the appropriate RFID antennas or coils 132.

In order to reduce the I/O pin count and trace routing complexity, for a given adapter 114, the RFID antennas 132 and LEDs 134 on both sides of the adapter 114 are coupled to the tray controller 164 and to power and ground using the same PCB traces. That is, a first set of PCB traces for coupling the RFID antennas 132 and LEDs 134 on the left side of each adapter 114 and a second, separate set of PCB for coupling the RFID antennas 132 and LEDs 134 on the right side of that adapter 114 need not be provided; instead, for each adapter 114, only a single set of PCB traces need be provided for coupling the RFID antennas 132 and LEDs 134 on both sides of each adapter 114 to the tray controller 164 and power and ground.

The analyzer 168 is also configured to communicate the information read from the RFID tags 128 to middleware software 170 in the manner described in the following US Patent Applications (all of which are hereby incorporated herein by reference): U.S. Provisional Patent Application Ser. No. 61/152,624, filed on Feb. 13, 2009, titled "MANAGED CONNECTIVITY SYSTEMS AND METHODS" (also referred to here as the "'624 Application"); U.S. patent application Ser. No. 12/705,497, filed on Feb. 12, 2010, titled "AGGREGATION OF PHYSICAL LAYER INFORMATION RELATED TO A NETWORK" (is also referred to here as the '497 Application); U.S. patent application Ser. No. 12/705,501, filed on Feb. 12, 2010, titled "INTER-NETWORKING DEVICES FOR USE WITH PHYSICAL LAYER INFORMATION" (also referred to here as the '501 Application); U.S. patent application Ser. No. 12/705,506, filed on Feb. 12, 2010, titled "NETWORK MANAGEMENT SYSTEMS FOR USE WITH PHYSICAL LAYER INFORMATION" (also referred to here as the '506 Application); U.S. patent application Ser. No. 12/705,514, filed on Feb. 12, 2010, titled "MANAGED CONNECTIVITY DEVICES, SYSTEMS, AND METHODS" (also referred to here as the '514 Application); U.S. Provisional Patent Application Ser. No. 61/252,395, filed on Oct. 16, 2009, titled "MANAGED CONNECTIVITY IN ELECTRICAL SYSTEMS AND METHODS THEREOF" (also referred to here as the "395 Application"); U.S. Provisional Patent Application Ser. No. 61/253,208, filed on Oct. 20, 2009, titled "ELECTRICAL PLUG FOR MANAGED CONNECTIVITY SYSTEMS" (also referred to here as the "'208 Application"); U.S. Provisional Patent Application Ser. No. 61/252,964, filed on Oct. 19, 2009, titled "ELECTRICAL PLUG FOR MANAGED CONNECTIVITY SYSTEMS" (also referred to here as the "'964 Application"); U.S. Provisional Patent Application Ser. No. 61/252,386, filed on Oct. 16, 2009, titled "MANAGED CONNECTIVITY IN FIBER OPTIC SYSTEMS AND METHODS THEREOF" (also referred to here as the "'386 Application"); U.S. Provisional Patent Application Ser. No. 61/303,961, filed on Feb. 12, 2010, titled "FIBER PLUGS AND ADAPTERS FOR MANAGED CONNECTIVITY" (the "'961 Application"); and U.S. Provisional Patent Application Ser. No. 61/303,948, filed on Feb. 12, 2010, titled "BLADED COMMUNICATIONS SYSTEM" (the "948 Application").

In on example, the middleware software 170 includes, or is coupled to a database or other data store (not shown) for storing the information provided to it. The middleware software 170 also includes functionality that provides an interface for external devices or entities to access the information maintained by the middleware software 170. This access can include retrieving information from the middleware software 170 as well as supplying information to the middleware software 170. In this example, the middleware software 170 is implemented as "middleware" that is able to provide such external devices and entities with transparent and convenient access to the information maintained by the middleware software 170. Because the middleware software 170 aggregates information from the relevant devices in the network and provides external devices and entities with access to such information, the external devices and entities do not need to individually interact with all of the devices in the network that provide such information, nor do such devices need to have the capacity to respond to requests from such external devices and entities.

The middleware software 170, in this example, implements an application programming interface (API) by which application-layer functionality can gain access to the physical layer information maintained by the middleware software 170 using a software development kit (SDK) that describes and documents the API.

One example of such middleware software 170 is the Infrastructure Configuration Manager (ICM) that is commercially available from TE Connectivity.

The analyzer 168 is also configured to instruct the subrack controller 162 and/or the tray controllers 164 to turn on the LEDs (or other visual indicators) 134 as appropriate (for example, in connection with instructing a technician in carrying out a work order or to signal an error condition). For example, the analyzer 168 can be configured to guide a technician in carrying out a work order by visually signally which ports 118 are to be affected by a particular step in the work order using the LEDs 134. Also, the LEDs 134 can be used to provide a visual indication as to whether each step was properly carried out. Data read from the RFID tags 18 is also used to determine if each step was properly carried out (for example, in similar manner as is described in the previously mentioned US patent applications).

Also, data can be written to the RFID tags 128 in the same manner.

Figure 9:
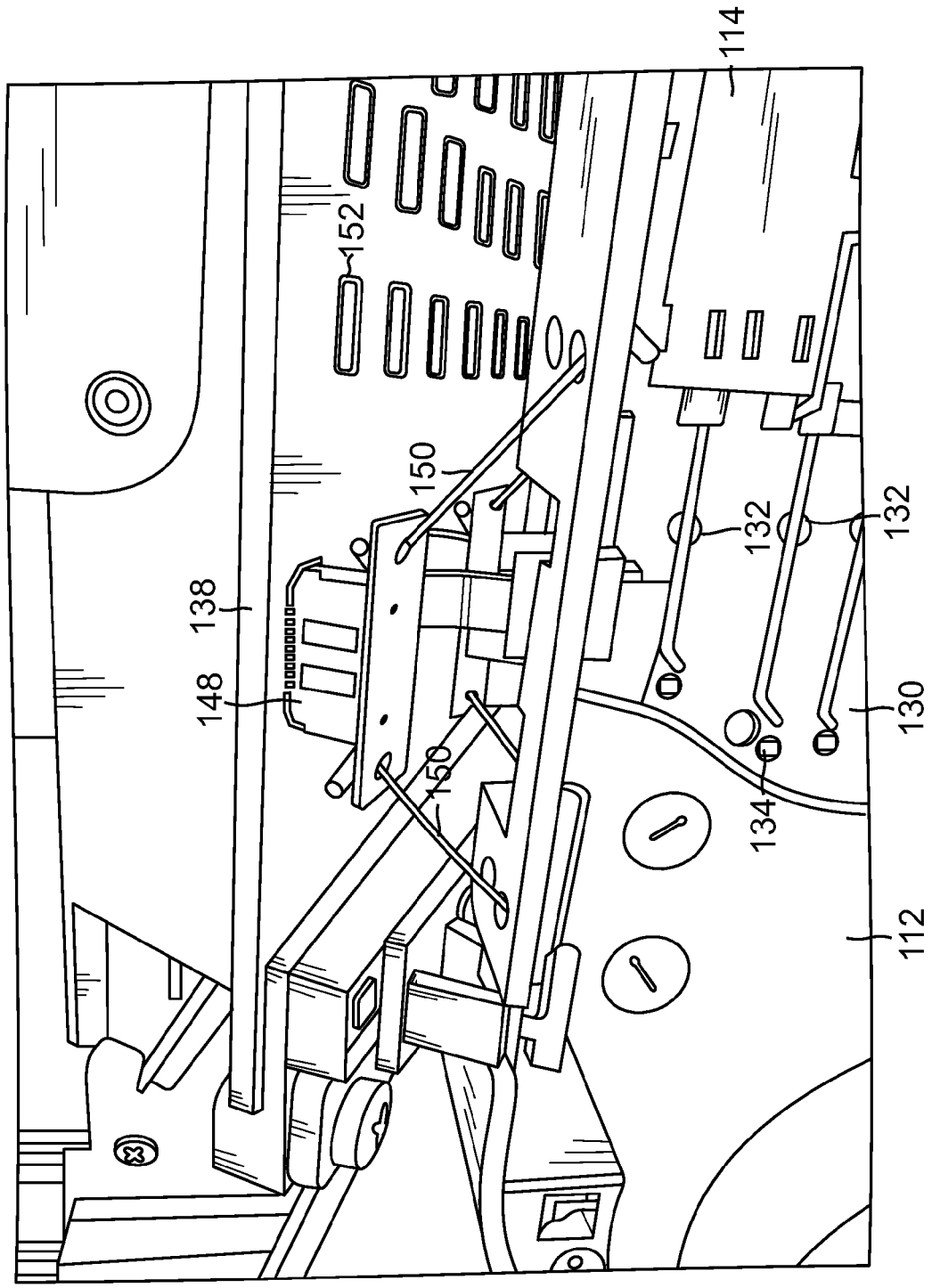

Communications occur between the analyzer 168 and the subrack and tray PCBs 136 and 130 via a cable 172 that connects the analyzer 168 to the subrack PCB 136. Also, power is supplied to the components on the subrack and tray PCBs 136 and 130 from the analyzer 168 on this cable 172. In one example, this connection is implemented as a RS422 serial connection. In this example, as shown in FIG. 9, the subrack PCB 136 includes two connectors 174 that can be used for connecting the cable 172 from the analyzer 168 to the subrack PCB 136. Also, these two connectors 174 can be oriented at an angle (for example, 30 degrees to 45 degrees) to facilitate routing this cable 172 in a manner that is compatible with the fiber optic cables in the rack 102. Either of the two connectors 174 can be used depending on what is more convenient for connecting to the analyzer 168. Also, the two connectors 174 can be used to connect multiple subracks 100 to the analyzer 168 using a daisy chain topology.

Figure 10:
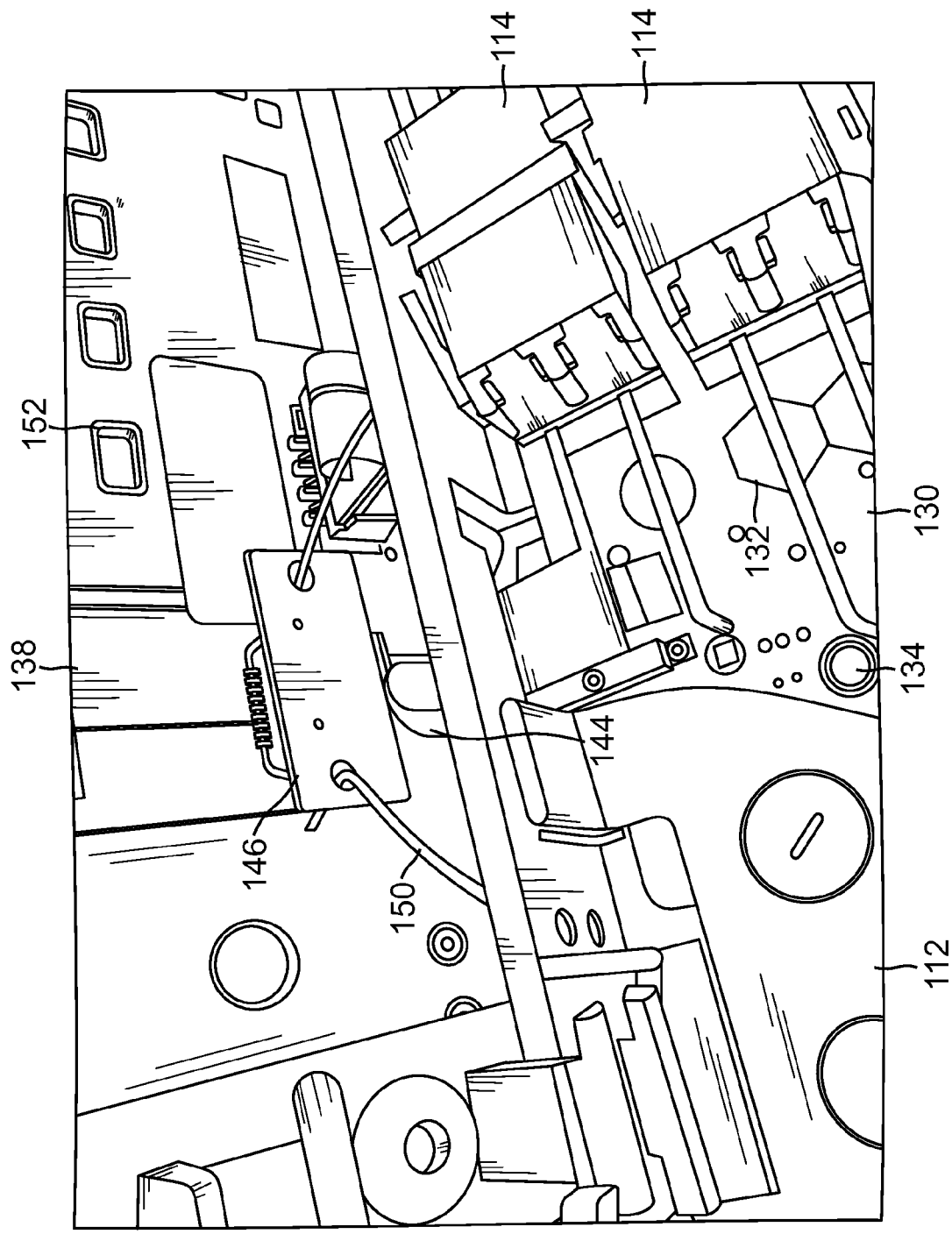
Figure 11:
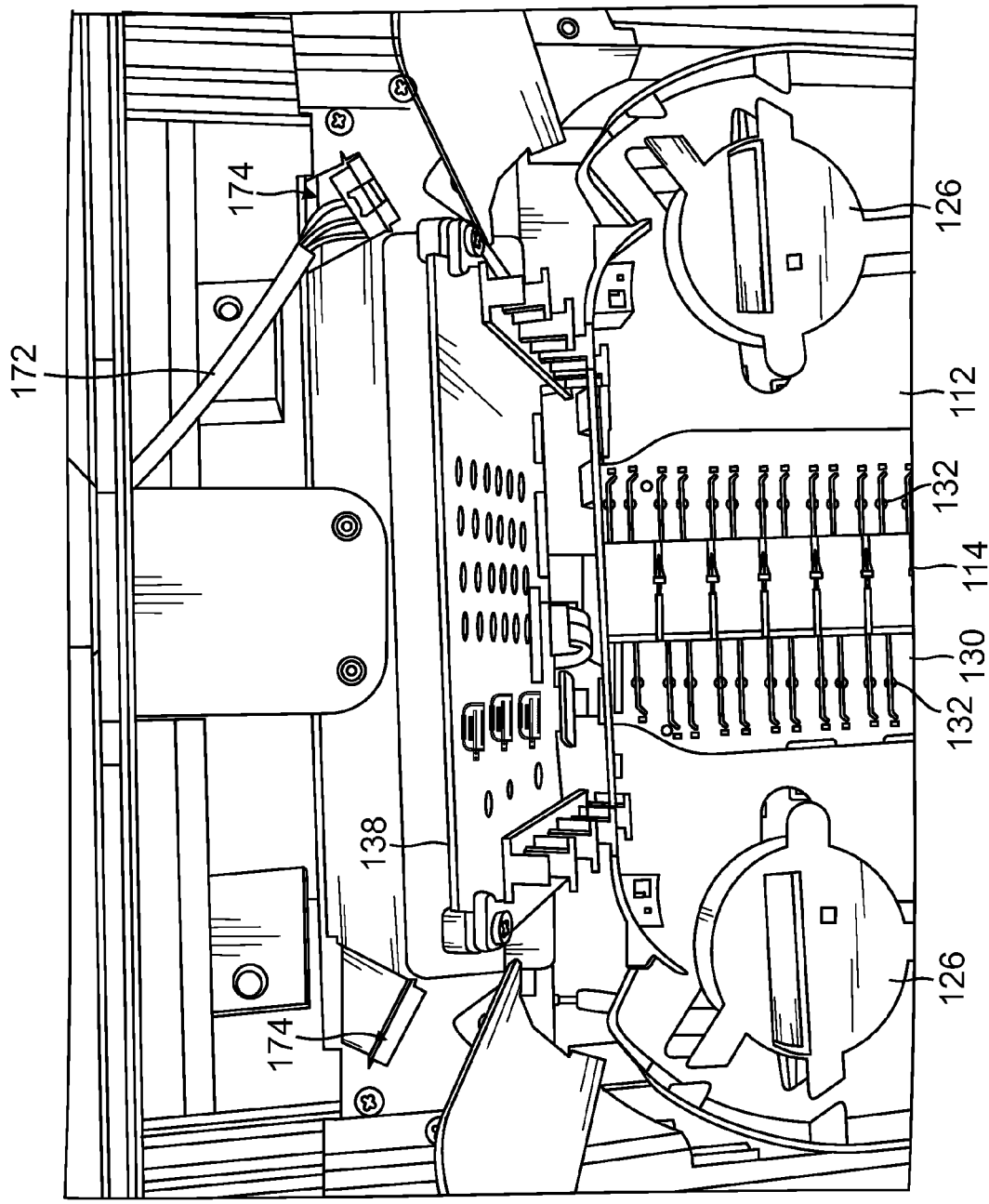

As shown in FIGS. 4 and 10, the tray 112 can include pockets 176 in the plastic of the tray 112 to accommodate components that are mounted to the underside of the tray PCB board 130. This enables the tray PCB 130 to lay flat in the tray 112.

In order to support a high density of RFID antennas 132 and fiber optic adapters 114, it is helpful to be able to localize or constrain the field emitted from each RFID antenna 134 so that only the appropriate RFID tag 128 is energized and read. One of example of how to do this is shown in FIG. 4. The ground planes surround the conductive plane in which the RFID inductors (coil or antenna) are formed. Openings are formed in the upper ground plane in order to enable RF signals to pass between the RFID antenna 134 and any RFID tag 128 positioned above it. The rest of the ground plane serves to constrain the RFID signals. Also, in this example, the openings formed in the bottom of the ground plane serve to let some of the RFID signals escape through the bottom to reduce the size of the field that is created above the tray PCB 130.

Figure 14:
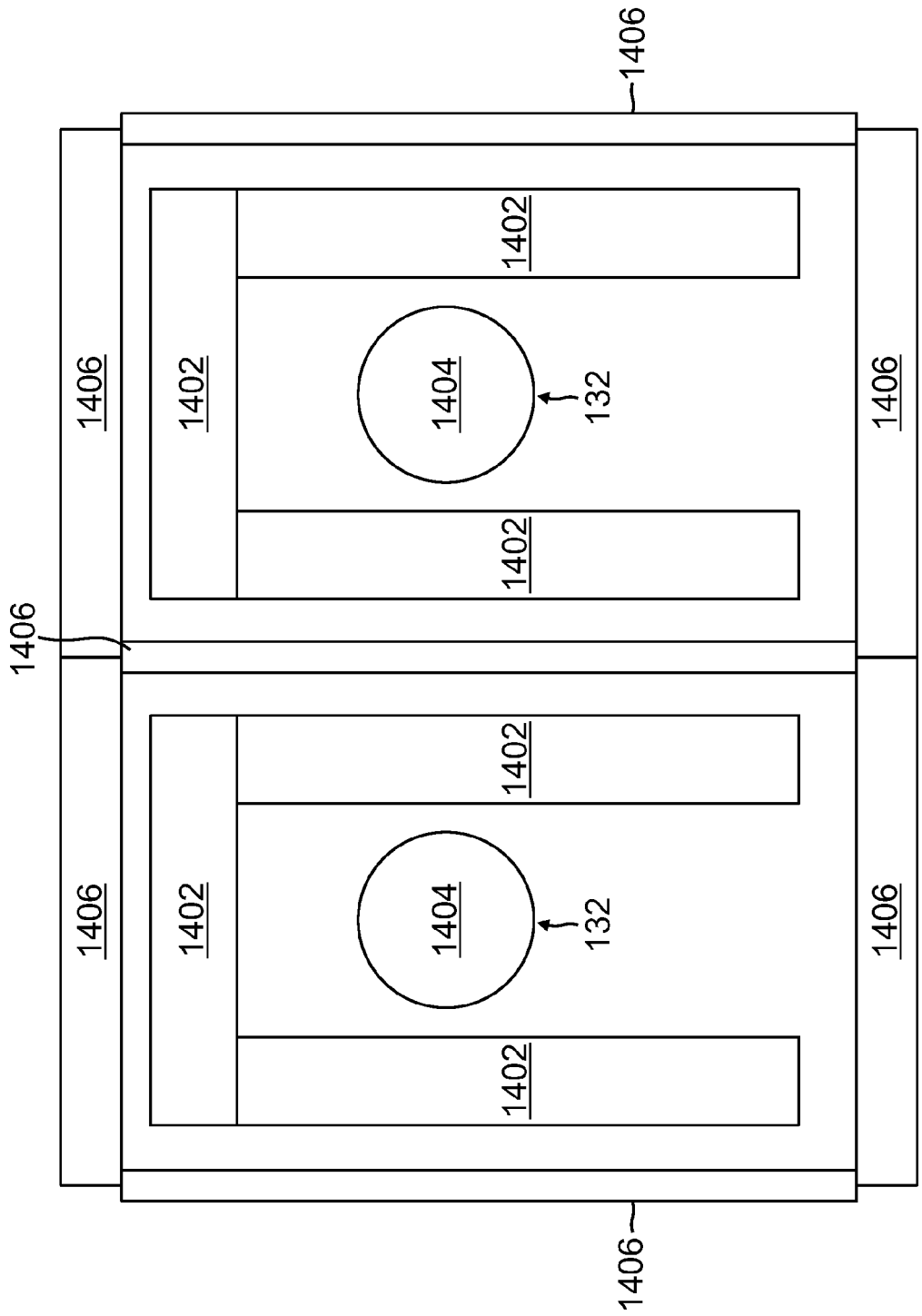
FIG. 14 illustrates another way in which radio frequency fields emitted by RFID antennas can be constrained that is suitable for use in the exemplary subrack of FIG. 1.

FIG. 14 illustrates another way in which radio frequency fields emitted by RFID antennas can be constrained that is suitable for use in the exemplary subrack of FIG. 1. In the example shown in FIG. 14, the layers of the tray PCB 130 are configured so that, for each RFID antenna 132 on each tray 113, the tray PCB 130 includes a multi-layer coil assembly 1404 that implements that RFID antenna 132.

The layers of the tray PCB 130 are also configured so that, for each RFID antenna 132 on each tray 113, the tray PCB 130 includes a respective C-shaped open copper track feature 1402 and a respective O-shaped closed copper track feature 1404 that concentrically surround the coil assembly 1404. In the particular example shown in FIG. 14, the C-shaped open feature 1404 is located inside of the O-shaped closed feature 1406. Each respective coil assembly 1402, C-shaped open feature 1404, and O-shaped closed feature 1406 are isolated from each another.

Each C-shaped open feature 1402 provides a dampening field for producing a rectangular region of interest (ROI) box for addressing misalignment problems that may otherwise occur in general usage. Each C-shaped open feature 1042 also provides rear field dampening to the tray 112 below. Each O-shaped closed features 1406 provides protection against cross-talk that may otherwise occur among adjacent RFID antennas 132, where each such O-shaped closed feature 1406 is implemented as shorted turn that produces a corresponding nulling field.

In some embodiments, it is necessary to position a daughter board 200 onto the tray PCBs 130. For example, in some embodiments, a storage device (such as an EEPROM) is attached to each of the fiber optic connectors 116, which is read in the manner described in the United States Patent Applications cited above. This is done instead of using RFID technology to read RFID tags 128. One example of this type of technology is the QUAREO technology that is commercially available from TE Connectivity. This technology is also referred to here as "Connection Point Identifier" or "CPID" technology.

In this example (which can be implemented using QUAREO technology), the storage device interface comprises four leads—a power lead, a ground lead, a data lead, and an extra lead that is reserved for future use. A suitable protocol (for example, the UNI/O protocol) can be used for communicating over the single data lead.

In such an example, four contacts are positioned above each adapter 114 that are configured to come into electrical contact with the four corresponding storage-device leads on a connector inserted in that adapter 114. Appropriate traces are provided on the tray PCB 130 in the tray 112 to couple these adapter contacts to the tray controller 164 via multiplexer 160 and to power and ground. The connectivity between the subrack controller 162 and the tray controllers 164 is provided in the manner described above. In this way, the QUAREO (or similar CPID) technology can be integrated into what is otherwise an RFID subrack 100 to support the mixing and matching of CPID and RFID trays in the field.

Figure 12:
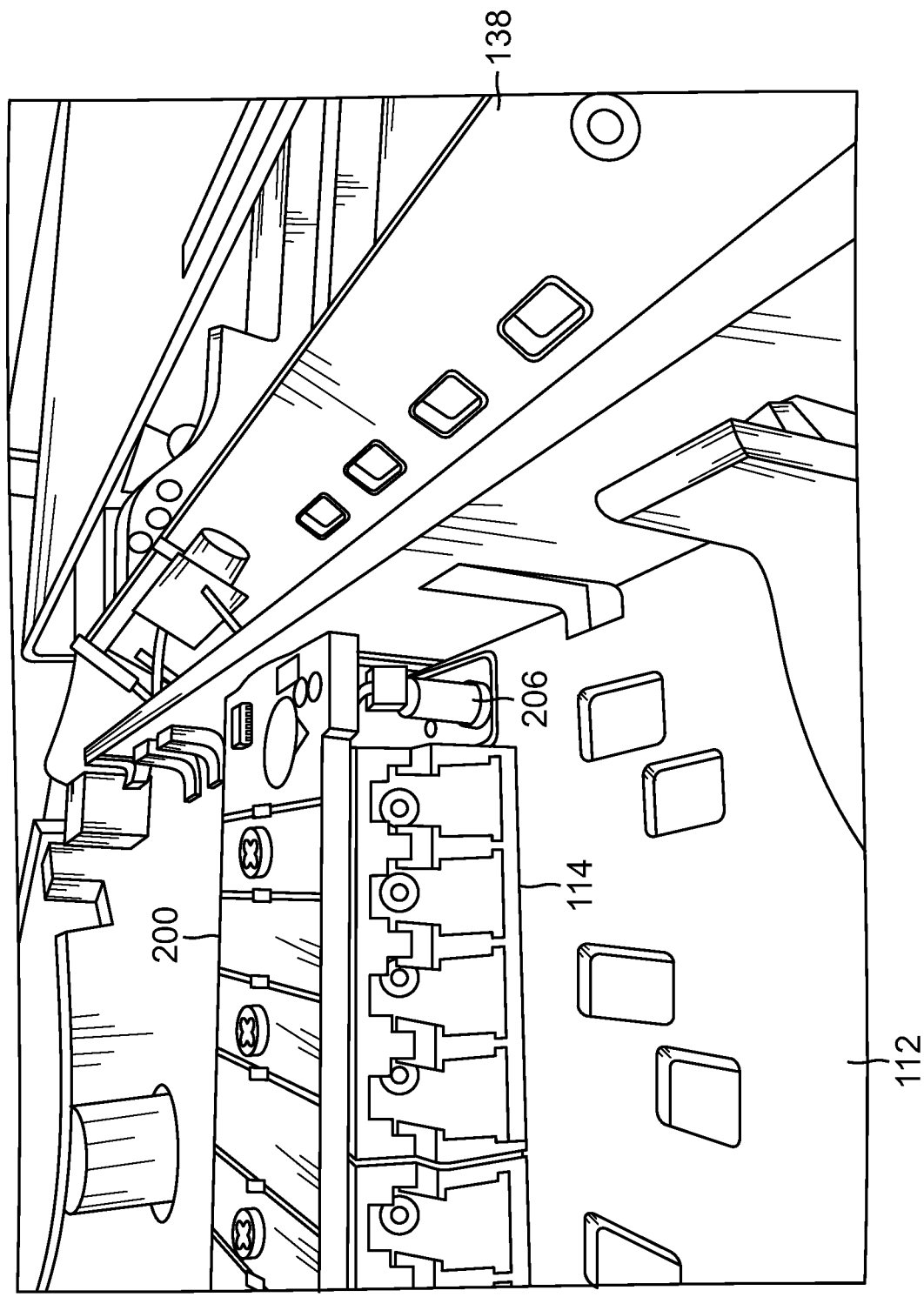
FIGS. 12-13 illustrate one way to attach a daughter board to a tray that is suitable for use with the exemplary subrack of FIG. 1.
Figure 13:
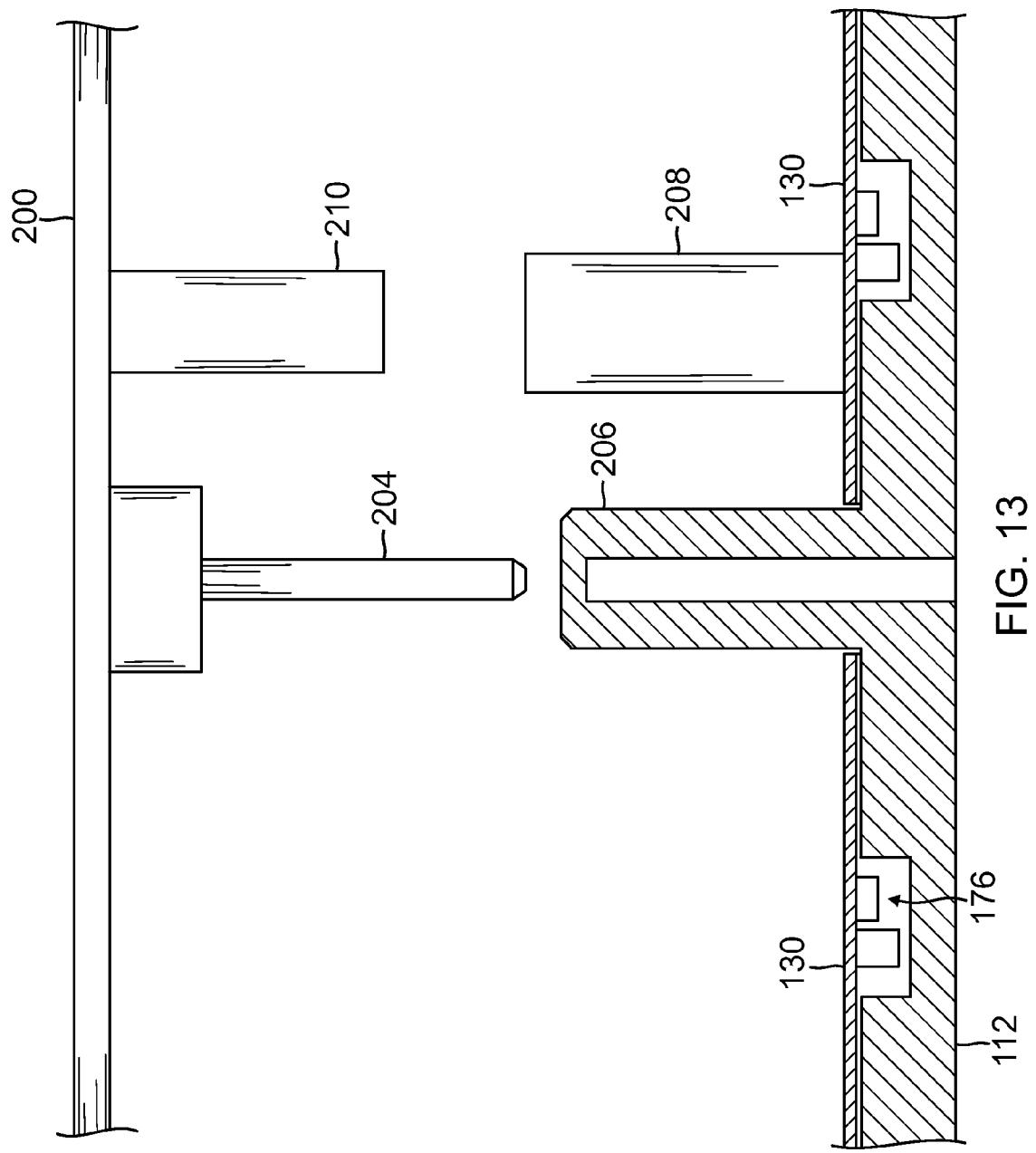

The contacts for reading the storage devices (also referred to here as "CPID contacts" 220) can be attached to a daughter board 200 (shown in FIGS. 12 and 13). It is helpful to precisely align this daughter board 200 while attaching it to an appropriate daughter-board connector 202 on the tray PCB 136. One way of doing this is shown in FIGS. 12 and 13. One side of the daughter board 200 has one or more metal pins 204 extending from it. The tray PCB 136 includes a corresponding plastic post 206. The pins 204 and posts 206 are arranged so that each pin 204 can be inserted into the top of a corresponding one of the posts 206 on the tray PCB 136. In this way, the connectors 210 and 208 on the daughterboard 200 and tray PCB 136 can more easily be connected while providing more precise alignment of the items on the daughter board 200 (for example, the interfaces for reading the EEPROMS, which in this example are positioned above the fiber optic adapters 114, which are preferably precisely aligned in order to read the EEPROMS).

Also, the CPID contacts 220 can be placed on both sides of the adapters 114 so that either side of the adapters 114 can be used as the patch field in the manner described above connection with RFID versions of trays. In order to reduce the I/O pin count and trace routing complexity, for a given adapter 114, CPID contacts 220 on both sides of the adapter 114 are coupled to the tray controller 164 and to power and ground using the same PCB traces. That is, a first set of PCB traces for coupling the CPID contacts 220 on the left side of each adapter 114 and a second, separate set of PCB for coupling the CPID contacts 22—on the right side of that adapter 114 need not be provided; instead, for each adapter 114, only a single set of PCB traces need be provided for coupling the CPID contacts 220 on both sides of each adapter 114 to the tray controller 164 and power and ground.

Although the preceding examples have been described above in connection with optical connectors and adapters, one of ordinary skill in the art can recognize that the techniques described here can be used with other types of communication media, such as copper communication media, connectors, and jacks and plugs (for example, those described in the United States Patent Applications described above).

A number of embodiments have been described. Nevertheless, it will be understood that various modifications to the described embodiments may be made without departing from the spirit and scope of the claimed invention.

Example Embodiments

Example 1 includes a tray for use in a subrack of a rack, the tray comprising: a printed circuit board configured so that a plurality of connections can be made at a plurality of positions on the printed circuit board, each of the plurality of connections involving at least one connector having an RFID tag associated therewith; a plurality of RFID antennas integrated into the printed circuit board, each the RFID antennas associated with a respective one of the positions; and wherein the printed circuit board is configured to localize a field emitted from each RFID antenna so that only the RFID tag associated with that RFID antenna is energized and read.

Example 2 includes the tray of Example 1, wherein the printed circuit board comprises a conductive plane surrounded on an upper side by a first ground plane and surrounded on a bottom side by a second ground plane; and wherein the RFID antennas are formed in the conductive layer of the printed circuit board.

Example 3 includes the tray Example 2, wherein, for each RFID antenna, a respective opening is formed in the upper ground plane so that radio frequency signals can pass between the respective RFID antenna and any RFID tag positioned near the opening, wherein the rest of the ground plane is configured to constrain the radio frequency signals emitted from the RFID antennas.

Example 4 includes the tray of Example 3, wherein, for each RFID antenna, a respective opening is formed in the bottom ground plane so that radio frequency signals can escape out through the respective opening in the bottom ground plane in order to reduce the size of the field created above the printed circuit board.

Example 5 includes the tray of any of the Examples 1-4, wherein the tray includes pockets formed in the tray to accommodate electronics.

Example 6 includes the tray of any of the Examples 1-5, wherein the tray comprises at least one of: a plurality of RFID antennas, each of the RFID antennas being associated with a respective one of the positions, wherein each of the plurality of RFID antennas can be selectively coupled to an RFID reader in order to read the RFID tags associated with the connectors involved in making the connections; and a plurality of visual indicators, each of the visual indicators being associated with a respective one of the positions.

Example 7 includes the tray of any of the Examples 1-6, wherein the tray is configured so that a plurality of fiber optic adapters can be attached to the printed circuit board, each of the plurality of fiber optic adapters associated with a respective one of the positions.

Example 8 includes the tray of any of the Examples 1-7, further comprising: a tray controller; and at least two communication ports, each of which is coupled to the tray controller, wherein the tray is configured so that the tray controller can be coupled to a controller external to the tray via one or more of the communication ports.

Example 9 includes the tray of Example 8, wherein the communication ports are angled.

Example 10 includes the tray of any of the Examples 1-9, wherein the each of the plurality of connections is made using between at least one of optical cabling and metallic cabling.

Example 11 includes the tray of any of the Examples 1-10, wherein the each of the plurality of connections is made using at least one of optical cabling and metallic cabling.

Example 12 includes a method of using a tray, the tray comprising a printed circuit board and a plurality of RFID antennas integrated into the printed circuit board, each the RFID antennas associated with a respective one of a plurality of positions on the printed circuit board, the method comprising: making a plurality of connections at the plurality of positions on the printed circuit board, each of the plurality of connections involving at least one connector having an RFID tag associated therewith; energizing and reading the RFID tags using the RFID antennas; and localizing a field emitted from each RFID antenna so that only the RFID tag associated with that RFID antenna is energized and read.

Example 13 includes the method of Example 12, wherein the printed circuit board comprises a conductive plane surrounded on an upper side by a first ground plane and surrounded on a bottom side by a second ground plane; and wherein the RFID antennas are formed in the conductive layer of the printed circuit board.

Example 14 includes the method of Example 13, wherein, for each RFID antenna, a respective opening is formed in the upper ground plane so that radio frequency signals can pass between the respective RFID antenna and any RFID tag positioned near the opening, wherein the rest of the ground plane is configured to constrain the radio frequency signals emitted from the RFID antennas.

Example 15 includes the method of Example 14, wherein, for each RFID antenna, a respective opening is formed in the bottom ground plane so that radio frequency signals can escape out through the respective opening in the bottom ground plane in order to reduce the size of the field created above the printed circuit board.

The invention claimed is:

1. A tray for use in a subrack of a rack, the tray comprising:
a printed circuit board configured so that a plurality of connections can be made at a plurality of positions on the printed circuit board, each of the plurality of connections involving at least one connector having an RFID tag associated therewith;
a plurality of RFID antennas integrated into the printed circuit board, each the RFID antennas associated with a respective one of the positions; and
wherein the printed circuit board is configured to localize a field emitted from each RFID antenna so that only the RFID tag associated with that RFID antenna is energized and read.

2. The tray of claim 1, wherein the printed circuit board comprises a conductive plane surrounded on an upper side by a first ground plane and surrounded on a bottom side by a second ground plane; and
wherein the RFID antennas are formed in the conductive layer of the printed circuit board.

3. The tray of claim 2, wherein, for each RFID antenna, a respective opening is formed in the upper ground plane so that radio frequency signals can pass between the respective RFID antenna and any RFID tag positioned near the opening, wherein the rest of the ground plane is configured to constrain the radio frequency signals emitted from the RFID antennas.

4. The tray of claim 3, wherein, for each RFID antenna, a respective opening is formed in the bottom ground plane so that radio frequency signals can escape out through the respective opening in the bottom ground plane in order to reduce the size of the field created above the printed circuit board.

5. The tray of claim 1, wherein the tray includes pockets formed in the tray to accommodate electronics.

6. The tray of claim 1, wherein the tray comprises at least one of:
a plurality of RFID antennas, each of the RFID antennas being associated with a respective one of the positions, wherein each of the plurality of RFID antennas can be selectively coupled to an RFID reader in order to read the RFID tags associated with the connectors involved in making the connections; and
a plurality of visual indicators, each of the visual indicators being associated with a respective one of the positions.

7. The tray of claim 1, wherein the tray is configured so that a plurality of fiber optic adapters can be attached to the printed circuit board, each of the plurality of fiber optic adapters associated with a respective one of the positions.

8. The tray of claim 1, further comprising:
a tray controller; and
at least two communication ports, each of which is coupled to the tray controller, wherein the tray is configured so that the tray controller can be coupled to a controller external to the tray via one or more of the communication ports.

9. The tray of claim 8, wherein the communication ports are angled.

10. The tray of claim 1, wherein the each of the plurality of connections is made using between at least one of optical cabling and metallic cabling.

11. The tray of claim 1, wherein the each of the plurality of connections is made using at least one of optical cabling and metallic cabling.

12. A method of using a tray, the tray comprising a printed circuit board and a plurality of RFID antennas integrated into the printed circuit board, each the RFID antennas associated with a respective one of a plurality of positions on the printed circuit board, the method comprising:

making a plurality of connections at the plurality of positions on the printed circuit board, each of the plurality of connections involving at least one connector having an RFID tag associated therewith;

energizing and reading the RFID tags using the RFID antennas; and localizing a field emitted from each RFID antenna so that only the RFID tag associated with that RFID antenna is energized and read.

13. The method of claim 12, wherein the printed circuit board comprises a conductive plane surrounded on an upper side by a first ground plane and surrounded on a bottom side by a second ground plane; and wherein the RFID antennas are formed in the conductive layer of the printed circuit board.

14. The method of claim 13, wherein, for each RFID antenna, a respective opening is formed in the upper ground plane so that radio frequency signals can pass between the respective RFID antenna and any RFID tag positioned near the opening, wherein the rest of the ground plane is configured to constrain the radio frequency signals emitted from the RFID antennas.

15. The method of claim 14, wherein, for each RFID antenna, a respective opening is formed in the bottom ground plane so that radio frequency signals can escape out through the respective opening in the bottom ground plane in order to reduce the size of the field created above the printed circuit board.

* * * * *